US010861787B1

(12) United States Patent
Sukekawa et al.

(10) Patent No.: US 10,861,787 B1
(45) Date of Patent: Dec. 8, 2020

(54) MEMORY DEVICE WITH BITLINE NOISE SUPPRESSING SCHEME

(71) Applicant: Micron Technology, Inc., Boise, ID (US)

(72) Inventors: Mitsunari Sukekawa, Hiroshima (JP); Christopher J. Kawamura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/534,120

(22) Filed: Aug. 7, 2019

(51) Int. Cl.
| G11C 11/4097 | (2006.01) |
| G11C 7/02 | (2006.01) |
| H01L 23/528 | (2006.01) |
| G11C 11/4091 | (2006.01) |
| H01L 27/108 | (2006.01) |
| H01L 25/18 | (2006.01) |
| H01L 23/58 | (2006.01) |
| G11C 7/18 | (2006.01) |

(52) U.S. Cl.
CPC .............. *H01L 23/528* (2013.01); *G11C 7/02* (2013.01); *G11C 7/18* (2013.01); *G11C 11/4091* (2013.01); *G11C 11/4097* (2013.01); *H01L 23/58* (2013.01); *H01L 25/18* (2013.01); *H01L 27/10805* (2013.01); *H01L 27/10897* (2013.01)

(58) Field of Classification Search
CPC .......... G11C 7/02; G11C 7/18; G11C 11/4097
USPC ........................................................ 365/206
See application file for complete search history.

(56) References Cited

U.S. PATENT DOCUMENTS

| 5,010,523 A | * | 4/1991 | Yamauchi | G11C 11/4099 365/205 |
| 5,105,385 A | * | 4/1992 | Ohtsuka | G11C 16/28 365/185.11 |
| 5,144,583 A | * | 9/1992 | Oowaki | H01L 27/10805 365/206 |
| 5,483,495 A | * | 1/1996 | Fukuda | G11C 7/18 365/203 |
| 5,629,887 A | * | 5/1997 | Nakano | G11C 11/4097 365/51 |
| 5,886,939 A | * | 3/1999 | Choi | G11C 7/14 365/210.15 |
| 6,124,199 A | * | 9/2000 | Gambino | H01L 23/522 257/239 |

(Continued)

OTHER PUBLICATIONS

Hidaka et al., "Twisted Bit-Line Architectures for Multi-Megabit DRAM's", IEEE Journal of Solid-State Circuits, vol. 24 No. 1, Feb. 1989, United States, pp. 21-27.

*Primary Examiner* — Son L Mai
(74) *Attorney, Agent, or Firm* — Wells St. John P.S.

(57) ABSTRACT

Some embodiments include an integrated memory having a first bitline coupled with a first set of memory cells, and having a second bitline coupled with a second set of memory cells. The first and second bitlines are comparatively coupled through a sense amplifier. A first noise suppression line is adjacent to a region of the first bitline and extends parallel to the region of the first bitline. The first noise suppression line is electrically connected with one of the first and second bitlines and not with the other of the first and second bitlines. A second noise suppression line is adjacent to a region of the second bitline and extends parallel to the region of the second bitline. The second noise suppression line is electrically connected with the other of the first and second bitlines.

24 Claims, 10 Drawing Sheets

(56) References Cited

U.S. PATENT DOCUMENTS

| | | | | |
|---|---|---|---|---|
| 6,222,784 B1* | 4/2001 | Kikuchi | ............... | G11C 11/4091 |
| | | | | 257/E21.657 |
| 6,496,402 B1* | 12/2002 | Somasekhar | ............ | G11C 7/02 |
| | | | | 365/63 |
| 6,545,935 B1* | 4/2003 | Hsu | ....................... | G11C 11/405 |
| | | | | 365/189.07 |
| 6,898,102 B2* | 5/2005 | Keeth | ...................... | G11C 7/18 |
| | | | | 365/206 |
| 6,987,698 B2* | 1/2006 | Bando | ..................... | G11C 7/02 |
| | | | | 365/189.07 |
| 8,351,247 B2* | 1/2013 | Ogawa | ................... | G11C 5/063 |
| | | | | 365/149 |
| 8,477,526 B2* | 7/2013 | Rountree | ................ | G11C 7/02 |
| | | | | 365/149 |
| 9,502,080 B2* | 11/2016 | Douzaka | ................ | G11C 5/10 |

* cited by examiner

MEMORY DEVICE WITH BITLINE NOISE SUPPRESSING SCHEME

TECHNICAL FIELD

Integrated circuitry; such as, for example, memory arrays. Bitline noise suppressing schemes for integrated memory.

BACKGROUND

Highly integrated memory has closely spaced memory cells and bitlines. Problems may be encountered due to undesired capacitive coupling between closely spaced bitlines. The capacitive coupling may have contributions from both inter-pair coupling between adjacent bitline pairs, and intra-pair coupling within bitline pairs (as discussed in the article "Twisted Bit-Line Architectures for Multi-Megabit DRAM's, by H. Hidaka, et. al.; IEEE Journal of Solid-State Circuits, Vol. 24, No. 1, February 1989; pgs. 21-27). The capacitive coupling may lead to excessive noise during data reading operations, and is becoming increasingly problematic with increasing levels of integration. It is desired to develop new architectures which can reduce or eliminate problematic capacitive coupling.

DETAILED DESCRIPTION OF THE ILLUSTRATED EMBODIMENTS

Some embodiments include integrated memory having noise suppression structures under bitlines. The noise suppression structures may be configured to reduce problematic parasitic capacitance that may be associated with the bitlines. The noise suppression structures may be electrically connected to the bitlines, and may also be electrically connected to sense amplifier circuitry. Sense amplifier circuit may also be coupled to control circuitry such as data read/write circuitry that may be composed of CMOS (complementary metal-oxide-semiconductor) circuitry. Example embodiments are described with reference to FIGS. 1-10.

Figure 1:
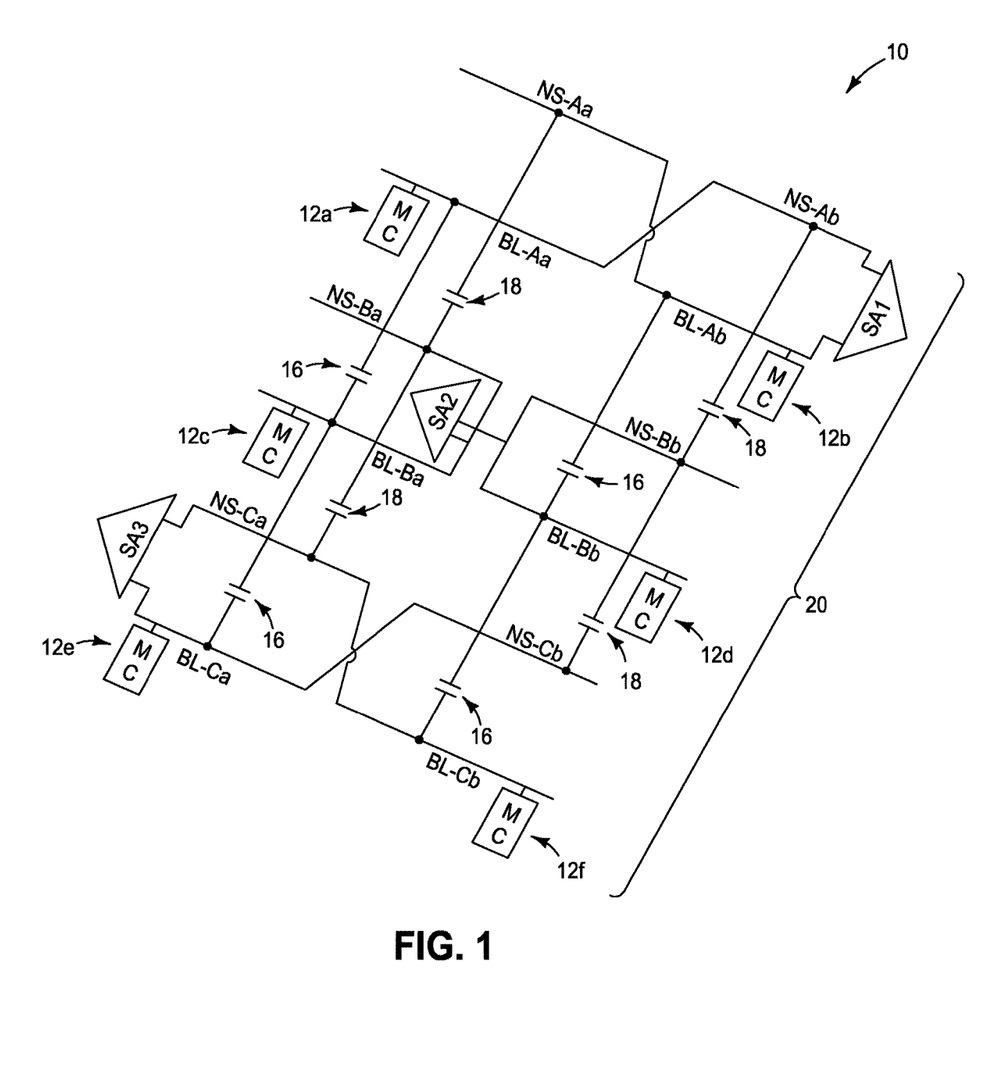
FIG. 1 is a diagrammatic schematic view of a region of an example integrated memory array.

Referring to FIG. 1, a region of an integrated memory 10 is schematically illustrated. The memory includes the bitlines BL-Aa, BL-Ab, BL-Ba, Bl-Bb, BL-Ca and BL-Cb; which may be referred to as first, second, third, fourth, fifth and sixth bitlines, respectively.

The bitlines are in paired relationships. Specifically, the bitlines BL-Aa and BL-Ab are paired with one another, and are comparatively coupled through a first sense amplifier (SA1); the bitlines BL-Ba and BL-Bb are paired with one another, and are comparatively coupled through a second sense amplifier (SA2); and the bitlines BL-Ca and BL-Cb are paired with one another, and are comparatively coupled through a third sense amplifier (SA3). For purposes of understanding this disclosure and the claims that follow, a pair of bitlines are "comparatively coupled" with one another through a sense amplifier if the sense amplifier is configured to compare electrical properties (e.g., voltages) of the bitlines.

The bitlines BL-Aa, BL-Ab, BL-Ba, Bl-Bb, BL-Ca and BL-Cb are associated with (coupled with) memory cells (MC). Specifically, the bitline BL-Aa is coupled with a first set of memory cells 12$a$, the bitline BL-Ab is coupled with a second set of memory cells 12$b$, the bitline BL-Ba is coupled with a third set of memory cells 12$c$, the bitline BL-Bb is coupled with a fourth set of memory cells 12$d$, the bitline BL-Ca is coupled with a fifth set of memory cells 12$e$, and the bitline BL-Cb is coupled with a sixth set of memory cells 12$f$.

The integrated memory 10 comprises noise suppression structures (e.g., noise suppression lines) NS-Aa, NS-Ab, NS-Ba, NS-Bb, NS-Ca and NS-Cb; which may be referred to as first, second, third, fourth, fifth and sixth noise suppression structures, respectively. The noise suppression structures may have any suitable configuration(s), and in some embodiments may be configured as lines having regions which extend parallel to neighboring bitlines (as described in more detail below with reference to FIG. 3). Memory cells (MC) are not along the noise suppression structures.

The integrated memory 10 may have inter-pair parasitic capacitance between bitlines of neighboring pairs, with example inter-pair capacitance being diagrammatically illustrated with capacitive arrangements 16.

The noise suppression structures (e.g. NS-Aa) are configured to generate counter-capacitive arrangements 18 which can alleviate, or even prevent, problems associated with the parasitic capacitance 16. In some embodiments, the noise suppression structures (e.g., NS-Aa) may be referred to as "dummy bitlines" to indicate that the noise suppression structures are similar to bitlines but are not coupled with memory cells.

The illustrated arrangement of FIG. 1 may be considered to correspond to a set 20 of three paired bitline arrangements (with the paired bitline arrangements being a first paired bitline arrangement BL-Aa/BL-Ab, a second paired bitline arrangement BL-Ba/BL-Bb and a third paired bitline arrangement BL-Ca/BL-Cb). The set 20 also includes the three sense amplifiers (SA1, SA2 and SA3) configured to comparatively compare the paired bitlines with one another.

The paired bitline arrangement BL-Aa/BL-Ab is configured such that the paired bitlines BL-Aa and BL-Ab cross one another (i.e., twist). In the illustrated embodiment, the first noise suppression structure NS-Aa is adjacent to a region of the first bitline BL-Aa, and extends parallel to such region of the first bitline. Similarly, the second noise suppression structure NS-Ab is adjacent to a region of the second bitline BL-Ab and extends parallel to such region of the second bitline. The first noise suppression structure NS-Aa is electrically coupled with the second bitline BL-Ab, and the second noise suppression structure NS-Ab is electrically coupled with the first bitline BL-Aa. In the illustrated embodiment, the second noise suppression structure NS-Ab is between the first bitline BL-Aa and the sense amplifier SA1.

The paired bitline arrangement BL-Ba/BL-Bb is configured such that the paired bitlines BL-Ba and BL-Bb do not cross one another (i.e., are untwisted), at least in a region proximate the second sense amplifier SA2. In the illustrated embodiment, the third noise suppression structure NS-Ba is adjacent to a region of the third bitline BL-Ba, and extends parallel to such region of the third bitline. Similarly, the fourth noise suppression structure NS-Bb is adjacent to a region of the fourth bitline BL-Bb and extends parallel to such region of the fourth bitline. The third noise suppression structure NS-Ba is electrically coupled with the third bitline BL-Ba, and the fourth noise suppression structure NS-Bb is electrically coupled with the fourth bitline BL-Bb.

The paired bitline arrangement BL-Ca/BL-Cb is configured such that the paired bitlines BL-Ca and BL-Cb cross one another (i.e., twist). In the illustrated embodiment, the fifth noise suppression structure NS-Ca is adjacent to a region of the fifth bitline BL-Ca, and extends parallel to such region of the fifth bitline. Similarly, the sixth noise suppression structure NS-Cb is adjacent to a region of the sixth bitline BL-Cb and extends parallel to such region of the sixth bitline. The fifth noise suppression structure NS-Ca is electrically coupled with the sixth bitline BL-Cb, and the sixth noise suppression structure NS-Cb is electrically coupled with the fifth bitline BL-Ca. In the illustrated embodiment, the fifth noise suppression structure NS-Ca is between the sixth bitline BL-Cb and the sense amplifier SA3.

The set 20 of FIG. 1 may be representative of a plurality of substantially-identical sets formed across a memory array; with the term "substantially identical" meaning identical to within reasonable tolerances of fabrication and measurement. Each of the sets may comprise three sense amplifiers and three paired arrangements of bitlines; with two of the three paired arrangements having bitlines which cross one another (i.e. twist), and with the third of the paired arrangements having bitlines which do not cross one another (at least in a region proximate the sense amplifier SA2). A memory array may have any suitable number of sets 20 of bitline arrangements, and in some embodiments may comprise hundreds, thousands, millions, etc., of such sets of bitline arrangements.

The twisted bitline configurations (e.g., the configuration comprising the bitlines BL-Aa and BL-Ab) and non-twisted bitline configurations (e.g., the configuration comprising the bitlines BL-Ba and BL-Bb) may be generically referred to as configurations having a first noise suppression line (e.g., NS-Aa or NS-Ba) adjacent a region of a first bitline (e.g., BL-Aa or BL-Ba) and extending parallel to the region of the first bitline; and having a second noise suppression line (e.g., NS-Ab or NS-Bb) adjacent a region of a second bitline (e.g., BL-Ab or BL-Bb), and extending parallel to the region of the second bitline. In the twisted bitline configuration, the first noise suppression line NS-Aa is electrically connected with the second bitline BL-Ab and not the first bitline BL-Aa; while the second noise suppression line NS-Ab is electrically connected with the first bitline BL-Aa and not the second bitline BL-Ab. In contrast, in the non-twisted bitline configuration, the first noise suppression line NS-Ba is electrically connected with the first bitline BL-Ba and not the second bitline BL-Bb; while the second noise suppression line NS-Bb is electrically connected with the second bitline BL-Bb and not the first bitline BL-Ba.

The memory cells MC of FIG. 1 may have any suitable configuration, and in some embodiments may be one-transistor-one-capacitor (1T-1C) memory cells. An example 1T-1C memory cell 12a is diagrammatically illustrated in FIG. 2. The other memory cells 12b-12f may be substantially identical to the illustrated memory cell 12a. The illustrated memory cell 12a may be a representative memory cell of a large number of memory cells formed along the bitline BL-Aa. For instance, in some embodiments there may be 8, 16, 32, 64, 128, etc., of the memory cells 12a provided along the bitline BL-Aa.

Figure 2:
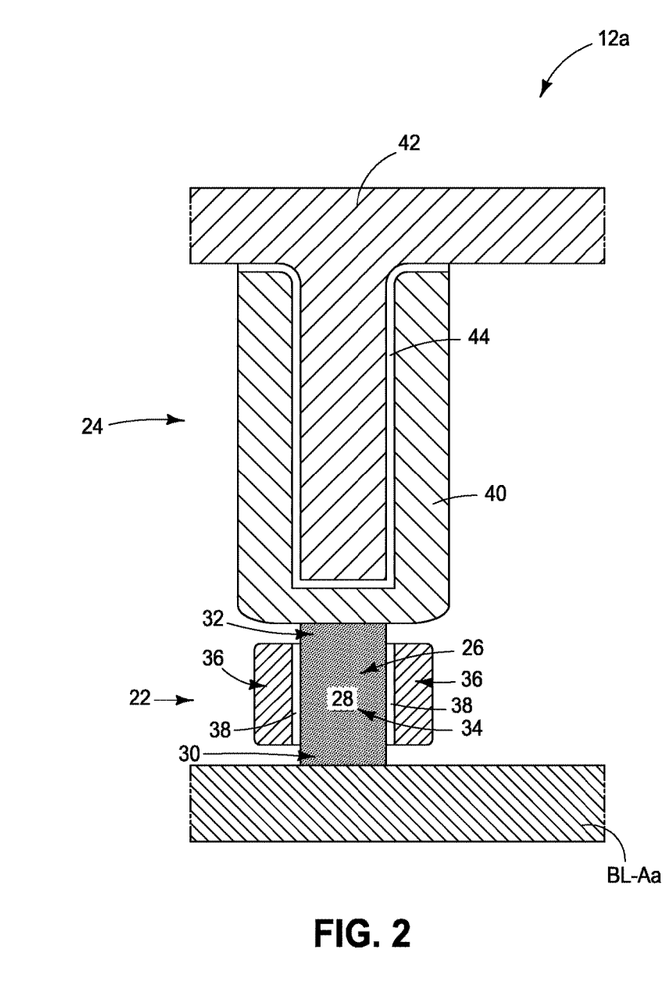
FIG. 2 is a diagrammatic cross-sectional side view of an example memory cell.

The illustrated memory cell 12a includes a transistor 22, and a capacitor 24 supported over the transistor. The transistor 22 includes a pedestal (pillar) 26 of semiconductor material 28. The semiconductor material 28 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 28 may comprise, consist essentially of, or consist of silicon (e.g., polycrystalline silicon).

A first source/drain region 30 is within a lower region of the semiconductor pedestal 26, and a second source/drain region 32 is within an upper region of the pedestal 26. A channel region 34 extends between the first and second source/drain regions 30 and 32.

A transistor gate 36 is adjacent to the channel region 34, and is spaced from the channel region by gate dielectric material 38.

The transistor gate 36 may be part of a wordline that extends in and out of the page relative to the cross-section of FIG. 2. The transistor gate 36 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The gate dielectric material 38 may comprise any suitable composition(s); and in some embodiments may comprise, consist essentially of, or consist of silicon dioxide.

The capacitor 24 comprises a first electrode 40, a second electrode 42, and a capacitor dielectric material 44 between the first and second electrodes.

The capacitor electrodes 40 and 42 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The capacitor dielectric material 44 may comprise any suitable composition(s); and in some embodiments may comprise, consist essentially of, or consist of silicon dioxide, silicon nitride and/or one or more high-k oxides (with the term "high-k" meaning a dielectric constant greater than that of silicon dioxide).

Figure 3:
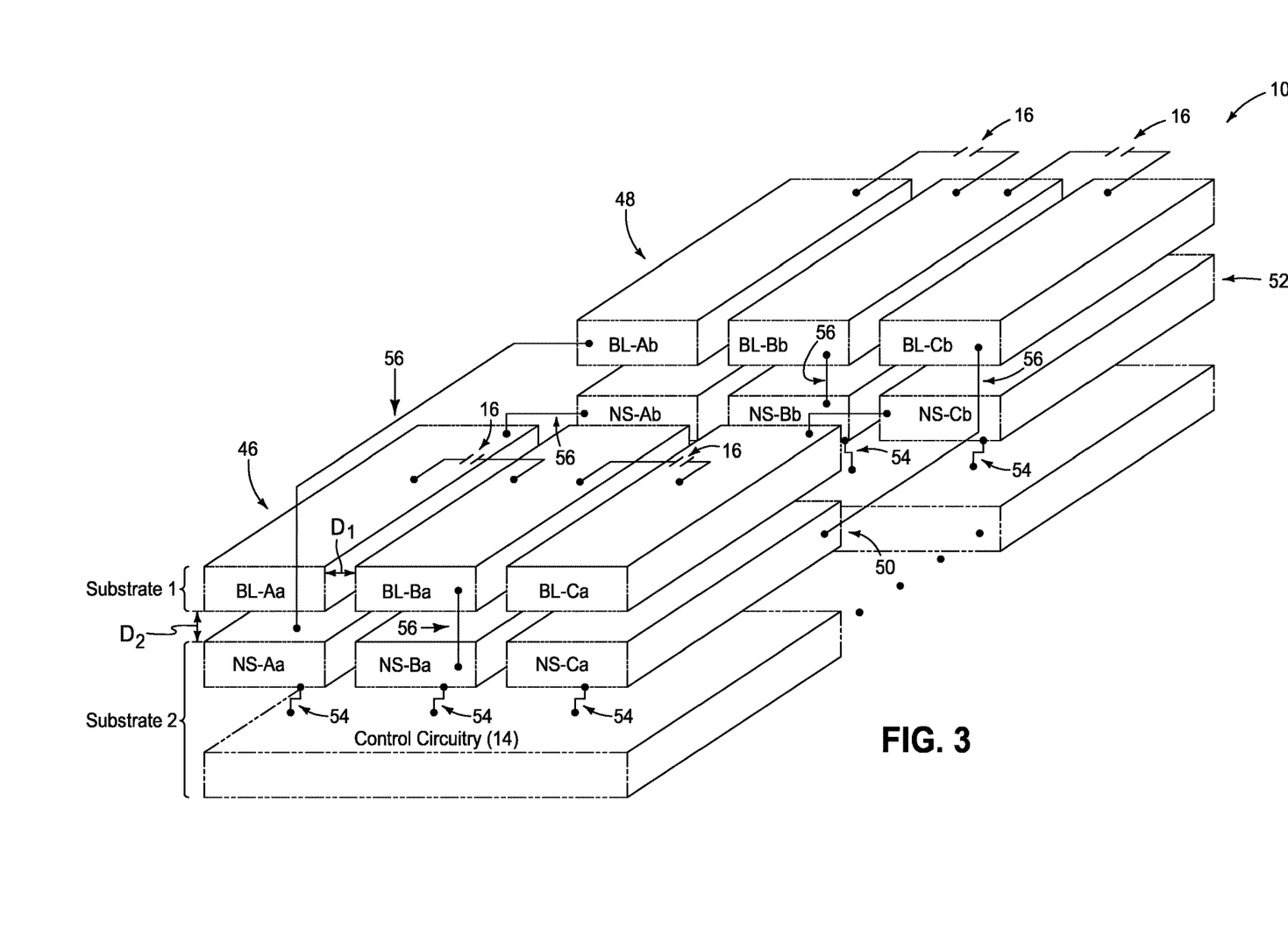
FIG. 3 is a diagrammatic three-dimensional view of a region of an example assembly comprising an example integrated memory array.

In some embodiments, the bitlines (e.g., BL-Aa) may be provided above the noise suppression structures (e.g., NS-Aa). For instance, FIG. 3 shows an example three-dimensional arrangement of the integrated memory 10. A first substrate (substrate 1) comprises the bitlines (e.g., BL-Aa), and a second substrate (substrate 2) comprises the noise suppression structures (e.g., NS-Aa). In the illustrated embodiment, the second substrate may also comprise sense amplifier circuitry and control (data read/write) circuitry (e.g., CMOS each); with the sense amplifier circuitry and the control circuitry being under the noise suppression structures (e.g., NS-Aa) and being generally labeled as "14". In other embodiments, the sense amplifier circuitry and/or the control circuitry may be part of a third substrate which is under a second substrate comprising the noise suppression structures.

The first and second substrates of FIG. 3 may be within different semiconductor dies, or may be at different elevational levels within the same semiconductor die.

The first, third and fifth bitlines (BL-Aa, BL-Ba and BL-Ca) are parallel to one another, and may be considered together to form a first set 46 of the bitlines. The second, fourth and sixth bitlines (BL-Ab, BL-Bb and BL-Cb) are parallel to one another, and may be considered together to form a second set 48 of the bitlines.

The second set 48 of the bitlines is laterally offset from the first set 46 of the bitlines. Possible inter-pair capacitances 16 are diagrammatically illustrated in FIG. 3 as being between adjacent bitlines (e.g., between the adjacent first and third bitlines BL-Aa and BL-Ba).

The noise suppression structures NS-Aa, NS-Ab, NS-Ba, NS-Bb, NS-Ca and NS-Cb comprise conductive lines under the bitlines BL-Aa, BL-Ab, BL-Ba, Bl-Bb, BL-Ca and BL-Cb. The conductive lines corresponding to the noise suppression structures NS-Aa, NS-Ab, NS-Ba, NS-Bb, NS-Ca and NS-Cb may be referred to as first, second, third, fourth, fifth and sixth conductive lines, respectively; or as first, second, third, fourth, fifth and sixth noise-suppression lines, respectively.

The first, third and fifth conductive lines (NS-Aa, NS-Ba and NS-Ca) are parallel to one another and together form a first set 50 of the conductive lines; and the second, fourth and sixth conductive lines (NS-Ab, NS-Bb and NS-Cb) are parallel to one another and together form a second set 52 of the conductive lines. The first set 50 of the conductive lines is directly under the first set 46 of the bitlines, and the second set 52 of the conductive lines is directly under the second set 48 of the bitlines. More specifically, the conductive lines NS-Aa, NS-Ba and NS-Ca are directly under the bitlines BL-Aa, BL-Ba and BL-Ca, respectively; and the conductive lines NS-Ab, NS-Bb and NS-Cb are directly under the bitlines BL-Ab, BL-Bb and BL-Cb, respectively.

In the illustrated embodiment, the bitlines are laterally spaced from one another by a first distance $D_1$ (as shown relative to the first and third bitlines BL-Aa and BL-Ba); and the bitlines are vertically spaced from the underlying noise suppression lines by a second distance $D_2$ (as shown relative to the first bitline BL-Aa and the first noise suppression line NS-Aa). The first distance $D_1$ may be about the same as (approximately equal to) the second distance $D_2$ (with the terms "about the same" and "approximately equal" meaning the same to within reasonable tolerances of fabrication and measurement), or may be different than the second distance $D_2$. In the shown embodiment, the distances $D_1$ and $D_2$ are about the same as one another.

Conductive interconnects 54 couple (electrically connect) the noise suppression structures (e.g., NS-Aa) with the control circuitry. Additional conductive interconnects 56 are diagrammatically illustrated forming electrical connections between the bitlines (e.g., BL-Aa) and the noise suppression structures (e.g., NS-Ab).

The electrical connections 56 between the bitlines and the noise suppression structures may comprise any suitable configurations. In some embodiments, the noise suppression structures may extend to underneath the bitlines which are to be coupled with such noise suppression structures, and the electrical connections 56 may comprise conductive bumps (e.g., bump electrodes) or wires.

The control circuitry 14 of the lower substrate (substrate 2) of FIG. 3 may comprise drivers suitable to provide desired electrical properties to the noise suppression structures (e.g., NS-Aa). The circuitry 14 of the lower substrate (substrate 2) may also comprise the sense amplifiers (e.g., SA1), may comprise wordline drivers, etc. The upper substrate of FIG. 3 (substrate 1) may comprise the memory cells (MC) in addition to comprising the bitlines (e.g., BL-Aa).

Figure 4:
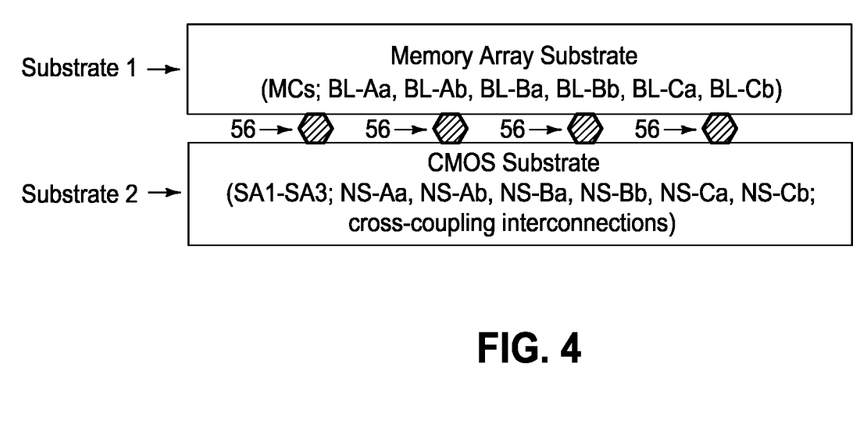
FIG. 4 is a block-diagram view of a region of an example layout of an example integrated assembly.

FIG. 4 diagrammatically illustrates electrical coupling between the upper substrate (substrate 1) and the lower substrate (substrate 2). The electrical coupling may include the interconnects 56 which couple the noise suppression structures (e.g., NS-Aa) with the bitlines (e.g., BL-Aa). In some embodiments, the electrical interconnects 56 may correspond to bump electrodes (as are diagrammatically shown in FIG. 4) and/or to wires.

Figure 5:
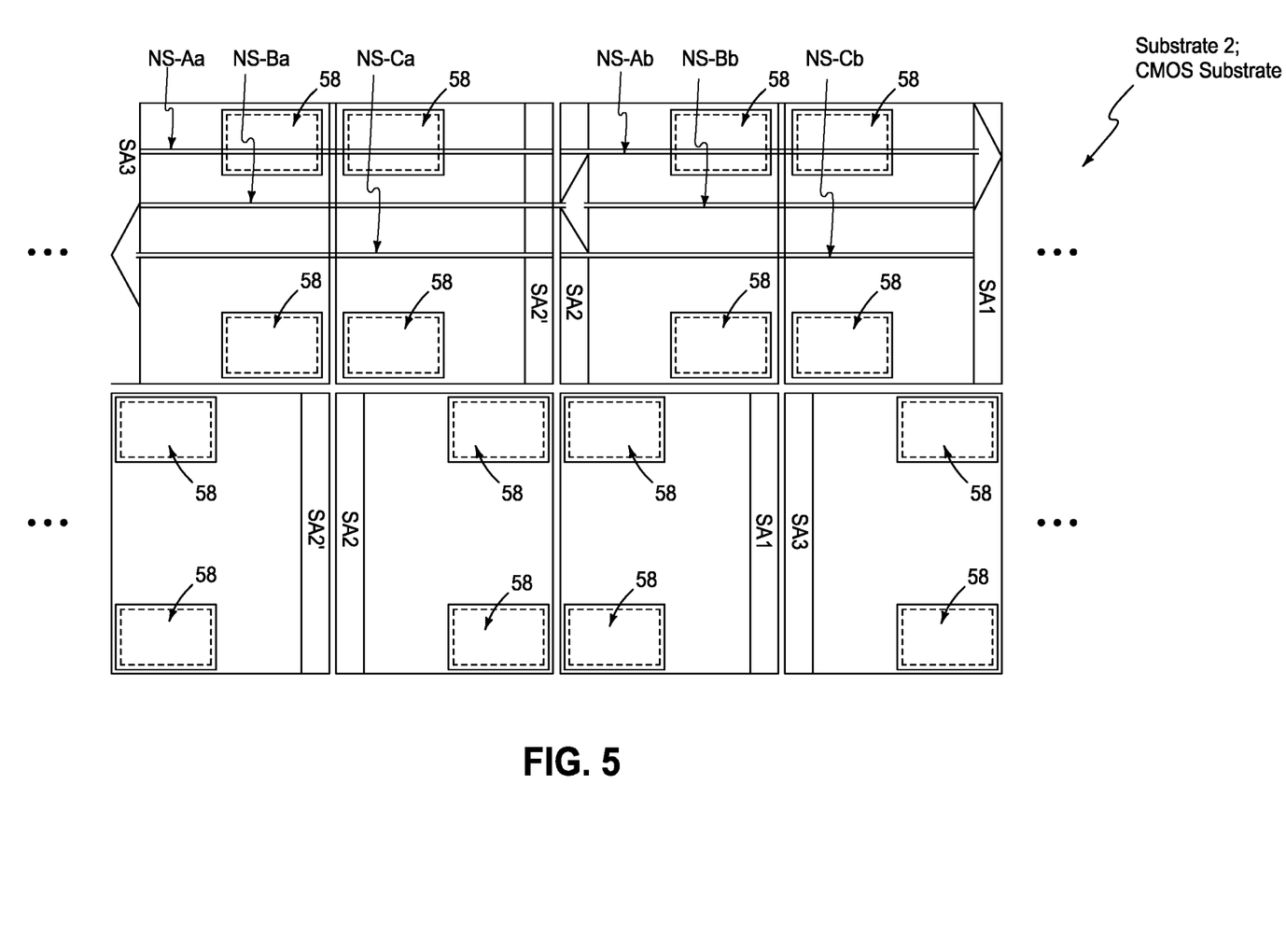
FIG. 5 is a top-down view of an example layout of an example integrated assembly.

The sense amplifiers (e.g., SA1) may be arranged in any suitable configuration relative to the lower substrate (substrate 2) of FIG. 3. FIG. 5 diagrammatically illustrates an example arrangement in which the second sense amplifier (SA2) is laterally disposed between the first and third sense amplifiers (SA1 and SA3).

The illustrated layout of the sense amplifiers provides multiple locations 58 suitable for placement of driver circuitry and/or other control circuitry. In some embodiments, the circuitry provided within the locations 58 may comprise CMOS circuitry, and accordingly the substrate may be referred to as a CMOS substrate.

Figure 6:
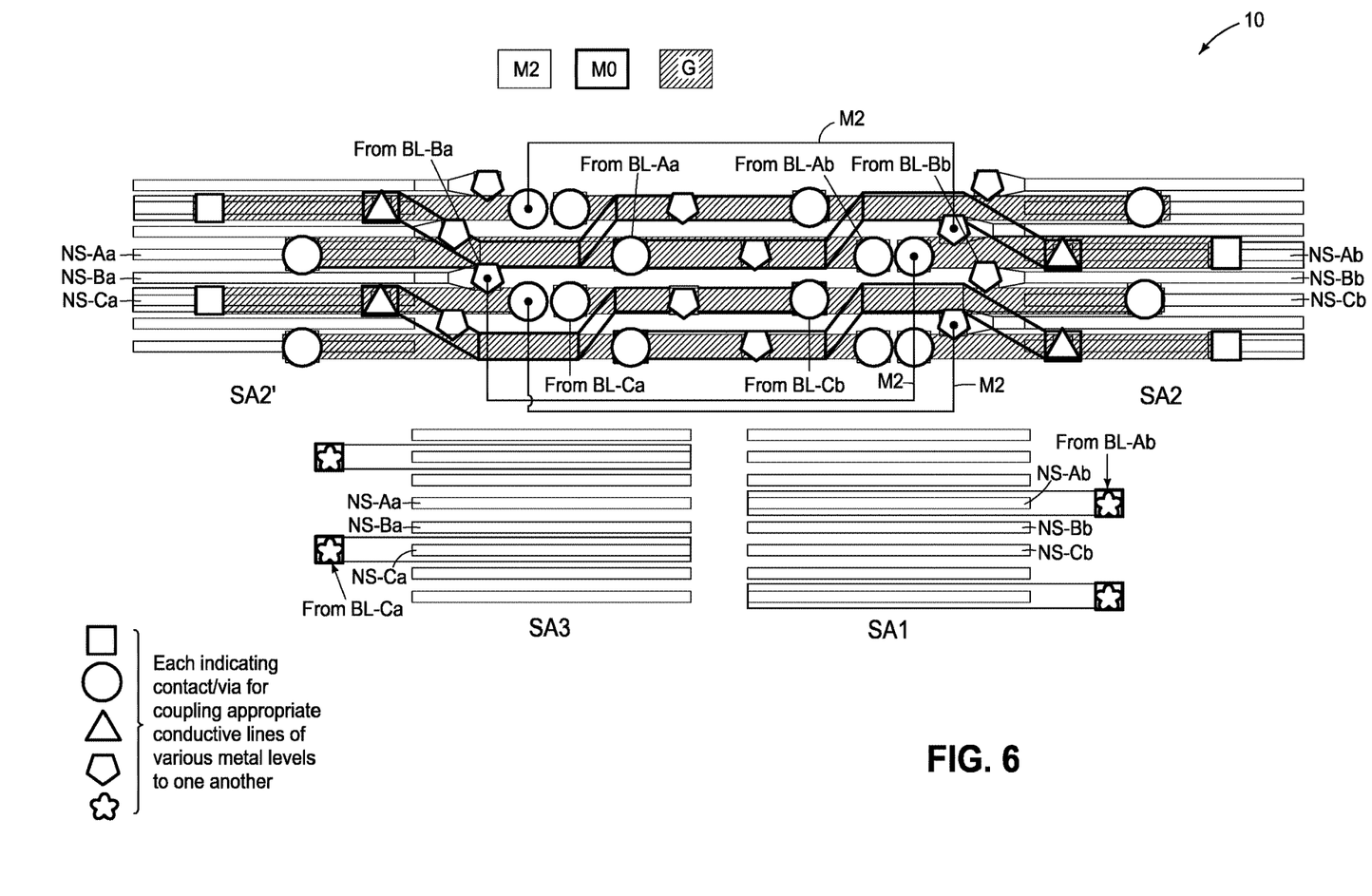
FIG. 6 is a top-down view of an example layout of an example integrated assembly.
Figure 7:
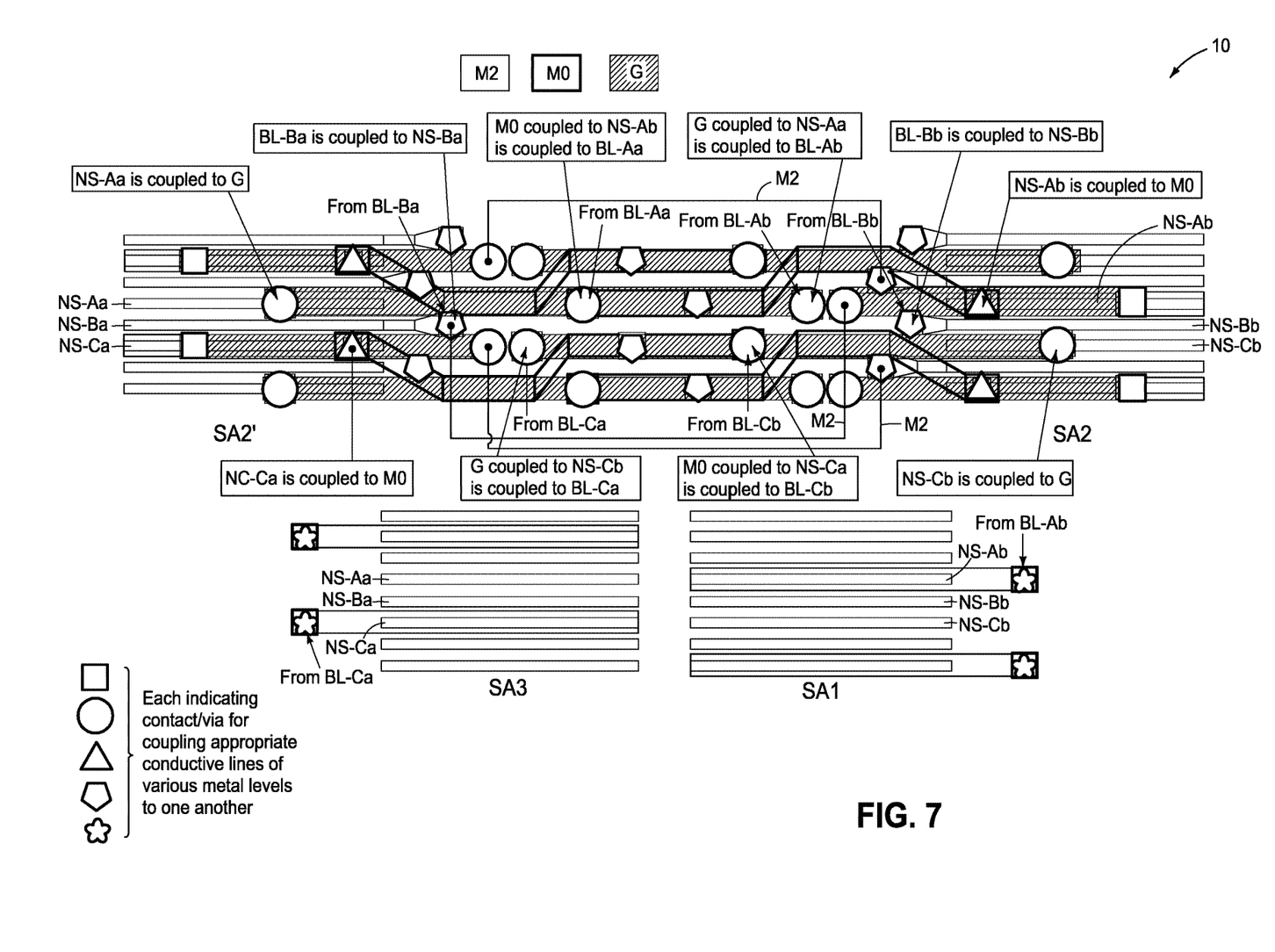
FIG. 7 is a top-down view of an example layout of an example integrated assembly. The view of FIG. 7 is of the same layout as is shown in the view of FIG. 6 and comprises additional information relative to the view of FIG. 6.

FIGS. 6 and 7 further illustrate an example layout which may be utilized for the integrated memory 10. The figures illustrate three conductive levels (a gate level, G; a first metal level, M0; and a third metal level, M2). FIG. 6 is simplified relative to FIG. 7. However, both diagrammatically illustrate a series of connections which can extend to one or more of the gate level, the M0 level and the M2 level. Also, some of the connections extend to a second metal level M1 (between the M0 level and the M2 level) and/or to CMOS circuitry.

The layout of FIGS. 6 and 7 is provided to assist the reader in understanding aspects of the present invention. It is to be understood, however, that the integrated memory 10 described above with reference to FIG. 1 may be formed with any suitable layout, including, but not limited to, the layout described with reference to FIGS. 6 and 7.

Figure 8:
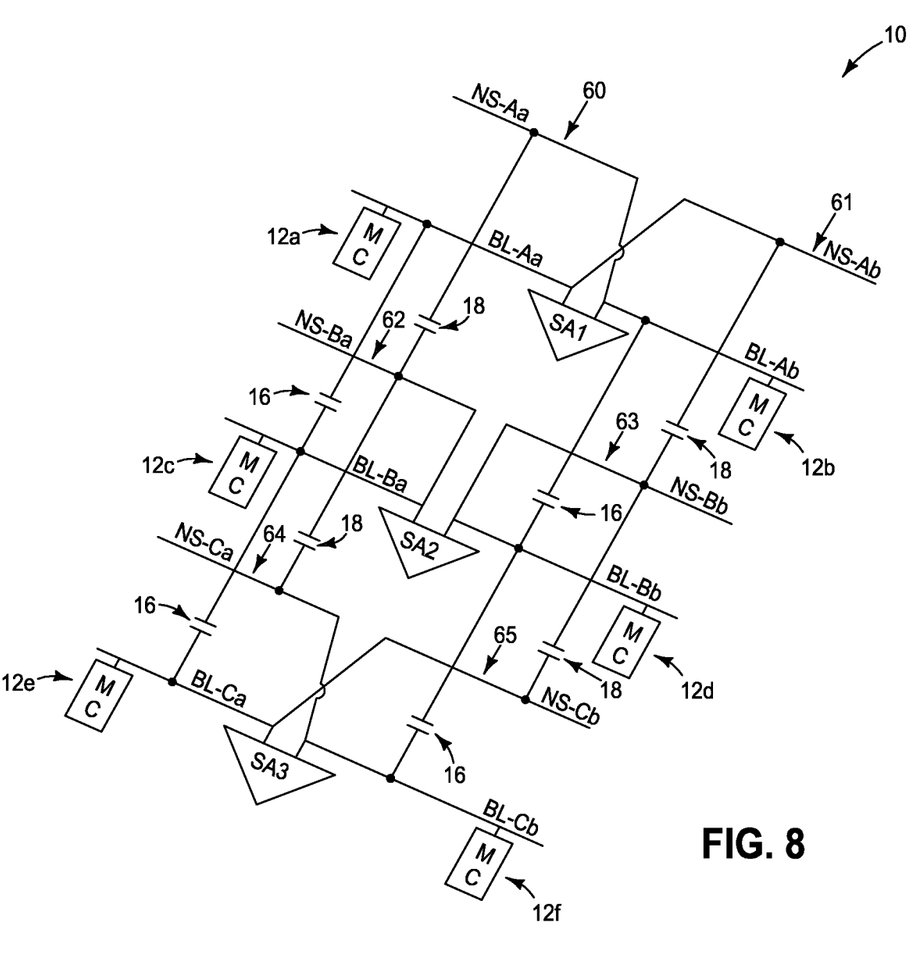
FIG. 8 is a diagrammatic schematic view of a region of an example integrated memory array.

FIG. 8 shows the integrated memory 10 in an arrangement in which the first, second and third sense amplifiers (SA1, SA2 and SA3) are aligned (i.e., are arranged in-line with one another).

Each of the noise suppression structures may be considered to correspond to a conductive line. Specifically, the first, second, third, fourth, fifth and sixth noise suppression structures (NS-Aa, NS-Ab, NS-Ba, NS-Bb, NS-Ca and NS-Cb) may be considered to correspond to conductive lines (noise suppression lines) 60-65, respectively. The conductive lines 60-65 may be referred to as a first conductive line, a second conductive line, a third conductive line, a fourth conductive line, a fifth conductive line and a sixth conductive line, respectively.

Figure 9:
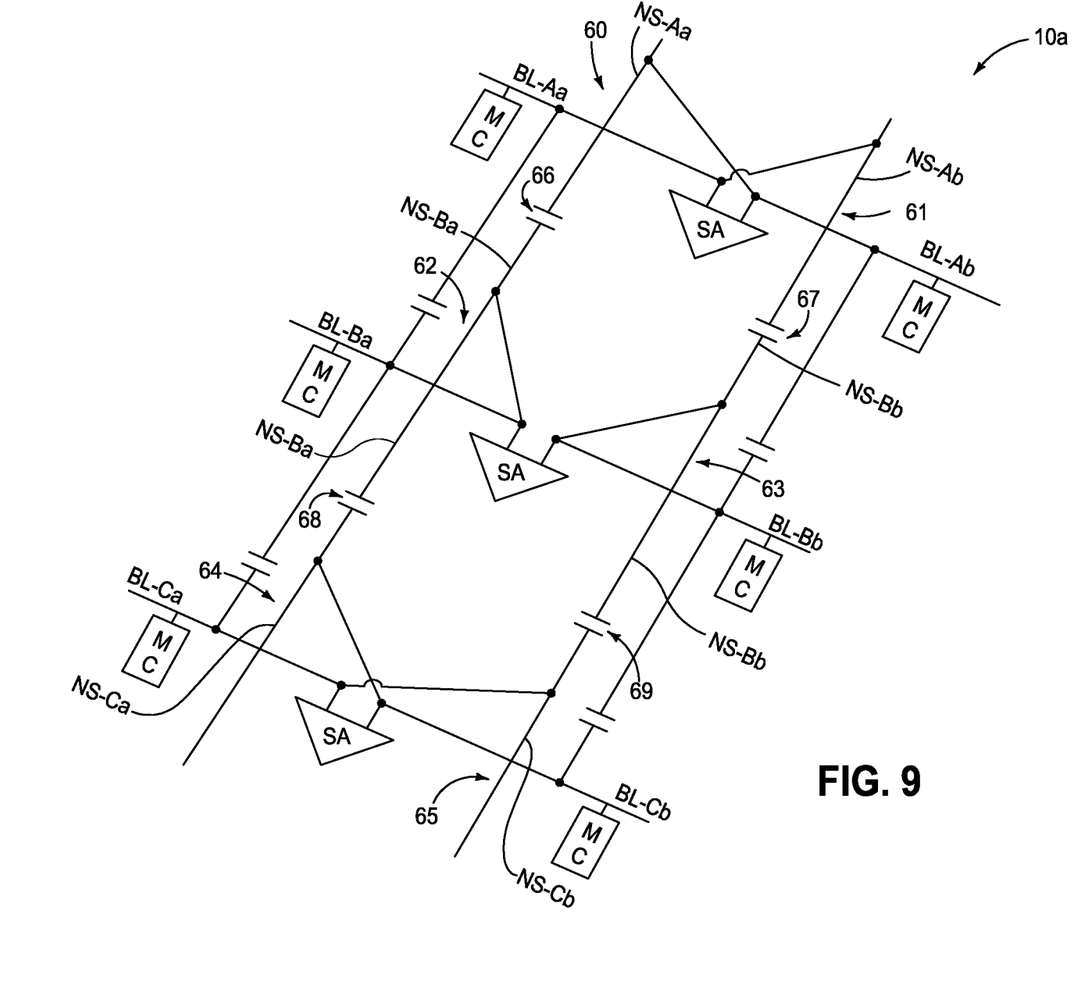
FIG. 9 is a diagrammatic schematic view of a region of an example integrated memory array.

FIG. 9 shows an integrated memory 10a which is similar to the integrated memory 10 of FIG. 8, but which comprises capacitors 66-69 along the CMOS substrate (also referred to herein as the control circuitry substrate); with the capacitors 66-69 being inserted between pairs of the conductive lines 60-65. In some embodiments, the capacitors 66-69 may be considered to replace the noise suppression structures (dummy bitlines), and in other embodiments the capacitors may be considered to be incorporated into the noise suppression structures (dummy bitlines).

In some embodiments, the configuration of FIG. 9 may be understood to comprise a first capacitor 66 between the first conductive line 60 and the third conductive line 62, to comprise a second capacitor 67 between the second conductive line 61 and the fourth conductive line 63, to comprise a third capacitor 68 between the third conductive line 62 and the fifth conductive line 64, and to comprise a fourth capacitor 69 between the fourth conductive line 63 and the sixth conductive line 65.

The sense-amplifier-circuitries SA1, SA2 and SA3 of the above-described embodiments may comprise any suitable configurations. An example sense-amplifier-circuitry 100 is diagrammatically illustrated in FIG. 10. A dashed line 71 is provided to show an approximate boundary of the sense-amplifier-circuitry. The illustrated sense-amplifier-circuitry 100 corresponds to the above-described SA1, and is utilized for comparatively comparing the digit lines BL-Aa and BL-Ab with one another. Identical sense-amplifier-circuitries may be utilized for SA2 and SA3.

Figure 10:
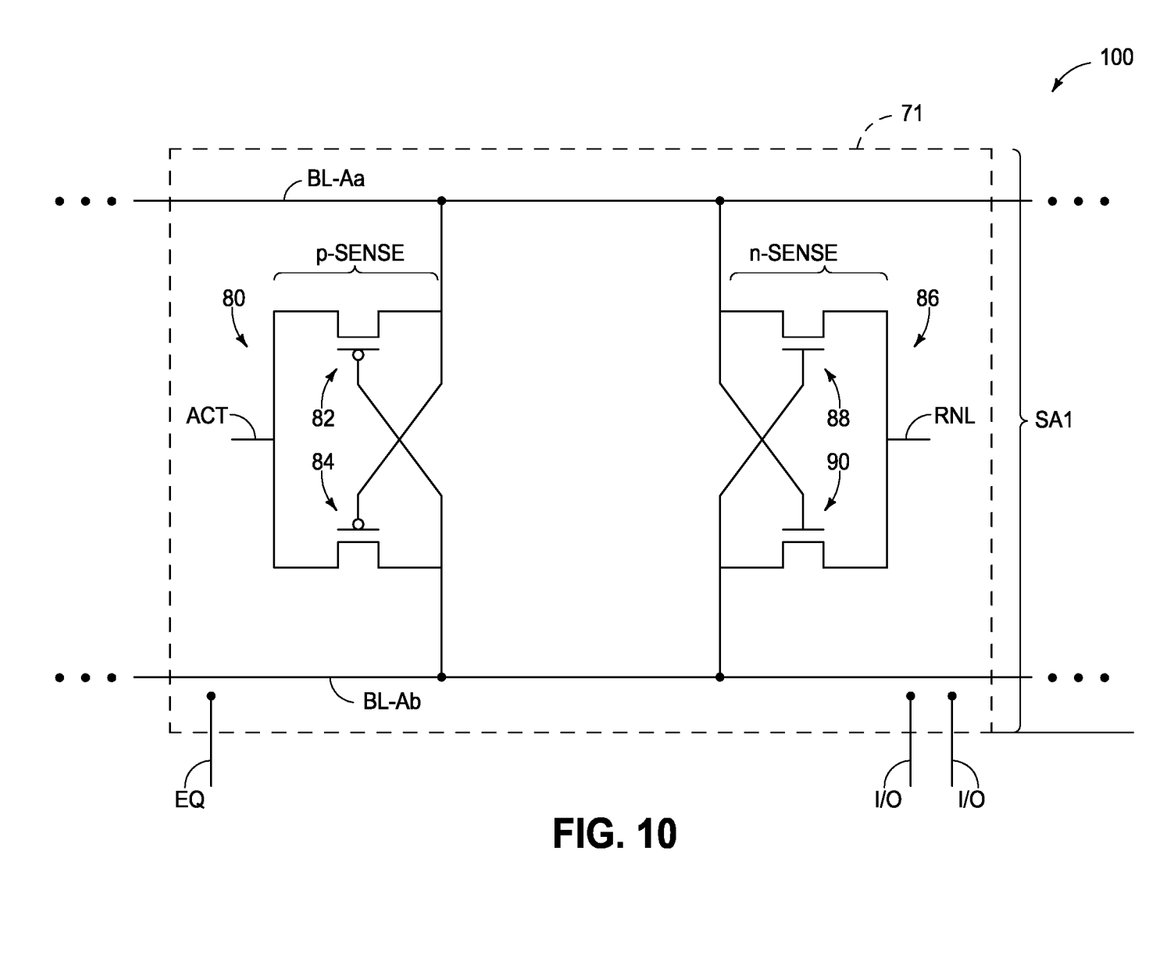
FIG. 10 is a diagrammatic schematic diagram of an example sense-amplifier-circuitry.

The sense-amplifier-circuitry 100 includes a p-sense amplifier 80 comprising a pair of cross-coupled pull-up transistors 82 and 84, and includes an n-sense amplifier 86 comprising a pair of cross-coupled pull-down transistors 88 and 90. The p-sense amplifier 80 is coupled with active pull-up circuitry (labeled ACT), and the n-sense amplifier 86 is coupled with a common node (labeled RNL). In operation the amplifiers 80 and 86 may be utilized together to detect the relative signal voltages of BL-Aa and BL-Ab, and to drive the higher signal voltage to VCC while driving the lower signal voltage to ground. Also, inputs and outputs associated with the sense amplifier (labeled as I/O) may be utilized for exporting data regarding the relative signal voltages of BL-Aa and BL-Ab, and/or for programming memory cells along one or both of BL-Aa and BL-Ab.

The illustrated sense-amplifier-circuitry also has equilibration circuitry (labeled EQ) provided therein to balance electrical properties within the sense amplifier. Other circuitry (not shown) may also be provided within the sense-amplifier-circuitry. The sense-amplifier-circuitry of FIG. 10 may comprise any suitable configuration, and in some embodiments may comprise conventional configurations.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated memory having a first bitline coupled with a first set of memory cells, and having a second bitline coupled with a second set of memory cells. The first and second bitlines are comparatively coupled to one another through a sense amplifier. A first noise suppression line is adjacent to a region of the first bitline and extends parallel to the region of the first bitline. The first noise suppression line is electrically connected with one of the first and second bitlines and not with the other of the first and second bitlines. A second noise suppression line is adjacent to a region of the second bitline and extends parallel to the region of the second bitline. The second noise suppression line is electrically connected with the other of the first and second bitlines.

Some embodiments include an integrated memory having a first bitline coupled with a first set of memory cells, a second bitline coupled with a second set of memory cells, a third bitline coupled with a third set of memory cells, a fourth bitline coupled with a fourth set of memory cells, a fifth bitline coupled with a fifth set of memory cells, and a sixth bitline coupled with a sixth set of memory cells. The first and second bitlines are comparatively coupled to one another through a first sense amplifier. The third and fourth bitlines are comparatively coupled to one another through a second sense amplifier. The fifth and sixth bitlines are comparatively coupled to one another through a third sense amplifier. First, second, third, fourth, fifth and sixth noise suppression structures are adjacent to regions of the first, second, third, fourth, fifth and sixth bitlines, respectively.

Some embodiments include an integrated memory having a first sense amplifier comparatively coupling a first pair of bitlines to one another. One of the bitlines of the first pair is a first bitline and the other is a second bitline. A second sense amplifier comparatively couples a second pair of bitlines to one another. One of the bitlines of the second pair is a third bitline and the other is a fourth bitline. A third sense amplifier comparatively couples a third pair of bitlines to one another. One of the bitlines of the third pair is a fifth bitline and the other is a sixth bitline. Regions of first, second, third, fourth, fifth and sixth noise suppression lines are directly under regions of the first, second, third, fourth, fifth and sixth bitlines, respectively. Memory cells are along the bitlines, and are not along the noise suppression lines. Control circuitry is electrically coupled with the first, second, third, fourth, fifth and sixth noise suppression lines. The first noise suppression line is electrically coupled with the second bitline. The second noise suppression line is electrically coupled with the first bitline. The third noise suppression line is electrically coupled with the third bitline. The fourth noise suppression line is electrically coupled with the fourth bitline. The fifth noise suppression line is electrically coupled with the sixth bitline. The sixth noise suppression line is electrically coupled with fifth bitline. A first substrate comprises the first, second, third, fourth, fifth and sixth bitlines. A second substrate comprises the first, second, third, fourth, fifth and sixth noise suppression lines. Conductive interconnects extend from the noise suppression lines of the second substrate to the bitlines of the first substrate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. Integrated memory, comprising:
   a first bitline coupled with a first set of memory cells;
   a second bitline coupled with a second set of memory cells;
   a sense amplifier; the first and second bitlines being comparatively coupled to one another through the sense amplifier;
   a first noise suppression line adjacent a region of the first bitline and extending parallel to said region of the first bitline; the first noise suppression line being electrically connected with one of the first and second bitlines and not with the other of the first and second bitlines; and
   a second noise suppression line adjacent a region of the second bitline and extending parallel to said region of the second bitline; the second noise suppression line being electrically connected with the other of the first and second bitlines.

2. The integrated memory of claim 1 wherein:
   the first and second bitlines are at a first elevational level; and
   the first and second noise suppression lines are at a second elevational level under the first elevational level.

3. The integrated memory of claim 2 wherein the first and second bitlines are formed in a first substrate and the sense amplifier and the first and second noise suppression lines are formed in a second substrate.

4. The integrated memory of claim 1 wherein the first and second noise suppression lines are electrically connected with the first and second bitlines, respectively.

5. The integrated memory of claim 1 wherein the first and second noise suppression lines are electrically connected with the second and first bitlines, respectively.

6. The integrated memory of claim 1 further comprising control circuitry coupled to the sense amplifier.

7. Integrated memory, comprising:
   a first bitline coupled with a first set of memory cells;
   a second bitline coupled with a second set of memory cells, the second bitline crossing the first bitline;
   a third bitline coupled with a third set of memory cells;
   a fourth bitline coupled with a fourth set of memory cells;
   a fifth bitline coupled with a fifth set of memory cells;
   a sixth bitline coupled with a sixth set of memory cells;
   a first sense amplifier; the first and second bitlines being comparatively coupled to one another through the first sense amplifier;
   a second sense amplifier; the third and fourth bitlines being comparatively coupled to one another through the second sense amplifier;
   a third sense amplifier; the fifth and sixth bitlines being comparatively coupled to one another through the third sense amplifier; and
   first, second, third, fourth, fifth and sixth noise suppression structures adjacent to regions of the first, second, third, fourth, fifth and sixth bitlines, respectively.

8. The integrated memory of claim 7 wherein the memory cells are one-transistor-one-capacitor (1T-1C) memory cells.

9. Integrated memory, comprising:
   a first bitline coupled with a first set of memory cells;
   a second bitline coupled with a second set of memory cells;
   a third bitline coupled with a third set of memory cells;
   a fourth bitline coupled with a fourth set of memory cells;
   a fifth bitline coupled with a fifth set of memory cells;
   a sixth bitline coupled with a sixth set of memory cells;
   a first sense amplifier; the first and second bitlines being comparatively coupled to one another through the first sense amplifier;
   a second sense amplifier; the third and fourth bitlines being comparatively coupled to one another through the second sense amplifier;
   a third sense amplifier; the fifth and sixth bitlines being comparatively coupled to one another through the third sense amplifier; and
   first, second, third, fourth, fifth and sixth noise suppression structures adjacent to regions of the first, second, third, fourth, fifth and sixth bitlines, respectively; wherein the first, second, third, fourth, fifth and sixth noise suppression structures include first, second, third, fourth, fifth and sixth conductive lines, respectively; and wherein:
   the first conductive line is coupled with the second bitline;
   the second conductive line is coupled with the first bitline;
   the third conductive line is coupled with the third bitline;

the fourth conductive line is coupled with the fourth bitline;
the fifth conductive line is coupled with the sixth bitline; and
the sixth conductive line is coupled with the fifth bitline.

10. The integrated memory of claim 9 wherein:
the second conductive line is between the first bitline and the first sense amplifier; and
the fifth conductive line is between the sixth bitline and the third sense amplifier.

11. The integrated memory of claim 9 further comprising:
a first capacitor between the first conductive line and the third conductive line;
a second capacitor between the second conductive line and the fourth conductive line;
a third capacitor between the third conductive line and the fifth conductive line; and
a fourth capacitor between the fourth conductive line and the sixth conductive line.

12. The integrated memory of claim 9 wherein:
the first, third and fifth bitlines are parallel to one another and together form a first set of the bitlines;
the second, fourth and sixth bitlines are parallel to one another and together form a second set of the bitlines; the second set of the bitlines being laterally offset from the first set of the bitlines;
the first, third and fifth conductive lines are parallel to one another and together form a first set of the conductive lines; the first set of the conductive lines being directly under the first set of the bitlines; the first conductive line being directly under the first bitline, the third conductive line being directly under the third bitline, and the fifth conductive line being directly under the fifth bitline; and
the second, fourth and sixth conductive lines are parallel to one another and together form a second set of the conductive lines; the second set of the conductive lines being directly under the second set of the bitlines; the second conductive line being directly under the second bitline, the fourth conductive line being directly under the fourth bitline, and the sixth conductive line being directly under the sixth bitline.

13. The integrated memory of claim 12 wherein:
the bitlines are comprised by a first substrate;
the conductive lines are comprised by a second substrate under the first substrate; and
conductive interconnects extend from the conductive lines of the second substrate to the bitlines of the second substrate.

14. The integrated memory of claim 13 wherein the sense amplifiers are also comprised by the second substrate.

15. The integrated memory of claim 14 further comprising control circuitry, and wherein the control circuitry is also comprised by the second substrate.

16. Integrated memory, comprising:
a first sense amplifier comparatively coupling a first pair of bitlines to one another; one of the bitlines of the first pair being a first bitline and the other being a second bitline;
a second sense amplifier comparatively coupling a second pair of bitlines to one another; one of the bitlines of the second pair being a third bitline and the other being a fourth bitline;
a third sense amplifier comparatively coupling a third pair of bitlines to one another; one of the bitlines of the third pair being a fifth bitline and the other being a sixth bitline;
regions of first, second, third, fourth, fifth and sixth noise suppression lines being directly under regions of the first, second, third, fourth, fifth and sixth bitlines, respectively; memory cells being along the bitlines, and not being along the noise suppression lines;
control circuitry coupled with the first, second, third, fourth, fifth and sixth noise suppression lines;
the first noise suppression line being coupled with the second bitline;
the second noise suppression line being coupled with the first bitline;
the third noise suppression line being coupled with the third bitline;
the fourth noise suppression line being coupled with the fourth bitline;
the fifth noise suppression line being coupled with the sixth bitline;
the sixth noise suppression line being coupled with fifth bitline;
a first substrate comprising the first, second, third, fourth, fifth and sixth bitlines;
a second substrate comprising the first, second, third, fourth, fifth and sixth noise suppression lines; and
conductive interconnects extending from the noise suppression lines of the second substrate to the bitlines of the first substrate.

17. The integrated memory of claim 16 comprising:
a first capacitor between the first noise suppression line and the third noise suppression line;
a second capacitor between the second noise suppression line and the fourth noise suppression line;
a third capacitor between third noise suppression line and the fifth noise suppression line; and
a fourth capacitor between fourth noise suppression line and the sixth noise suppression line.

18. The integrated memory of claim 16 wherein at least some of the conductive interconnects are bump electrodes.

19. The integrated memory of claim 16 wherein the bitlines are coupled with one-transistor-one-capacitor (1T-1C) memory cells.

20. The integrated memory of claim 16 wherein the second substrate comprises the control circuitry.

21. The integrated memory of claim 16 wherein the second substrate comprises the first, second and third sense amplifiers.

22. The integrated memory of claim 16 wherein the second sense amplifier is laterally disposed between the first and third sense amplifiers.

23. The integrated memory of claim 16 wherein the first bitline and the third bitline are laterally adjacent to one another, and are spaced from one another by a first distance; and wherein the first bitline and the first noise suppression line are spaced from one another by a second distance which is approximately equal to the first distance.

24. The integrated memory of claim 16 wherein the first bitline and the third bitline are laterally adjacent to one another, and are spaced from one another by a first distance; and wherein the first bitline and the first noise suppression line are spaced from one another by a second distance which is different from the first distance.

* * * * *